United States Patent
Asaba et al.

(10) Patent No.: US 12,527,056 B2
(45) Date of Patent: Jan. 13, 2026

(54) SEMICONDUCTOR DEVICE AND SEMICONDUCTOR DEVICE MANUFACTURING METHOD

(71) Applicants: TOSHIBA ELECTRONIC DEVICES & STORAGE CORPORATION, Tokyo (JP); KABUSHIKI KAISHA TOSHIBA, Tokyo (JP)

(72) Inventors: Shunsuke Asaba, Himeji Hyogo (JP); Makoto Mizukami, Ibo Hyogo (JP)

(73) Assignees: Toshiba Electronic Devices & Storage Corporation, Kawasaki (JP); Kabushiki Kaisha Toshiba, Kawasaki (JP)

( * ) Notice: Subject to any disclaimer, the term of this patent is extended or adjusted under 35 U.S.C. 154(b) by 646 days.

(21) Appl. No.: 17/681,856

(22) Filed: Feb. 28, 2022

(65) Prior Publication Data
US 2023/0092391 A1    Mar. 23, 2023

(30) Foreign Application Priority Data
Sep. 22, 2021    (JP) .................................. 2021-154469

(51) Int. Cl.
| | | |
|---|---|---|
| *H10D 62/832* | (2025.01) | |
| *H01L 21/02* | (2006.01) | |
| *H10D 30/66* | (2025.01) | |
| *H10D 64/62* | (2025.01) | |
| *H10D 64/64* | (2025.01) | |

(52) U.S. Cl.
CPC ... *H10D 62/8325* (2025.01); *H01L 21/02529* (2013.01); *H10D 30/66* (2025.01); *H10D 64/62* (2025.01); *H10D 64/64* (2025.01)

(58) Field of Classification Search
CPC ..... H01L 29/1608; H01L 29/435–4983; H01L 29/02529; H10D 62/8325; H10D 30/66
See application file for complete search history.

(56) References Cited

U.S. PATENT DOCUMENTS

| | | | | |
|---|---|---|---|---|
| 5,565,708 A | * | 10/1996 | Ohsaki | H01L 21/28518 257/770 |
| 10,141,410 B2 | | 11/2018 | Shimizu | |
| 2005/0173739 A1 | * | 8/2005 | Kusumoto | H10D 30/635 257/280 |
| 2016/0087045 A1 | * | 3/2016 | Shimizu | H10D 30/66 257/77 |
| 2017/0200787 A1 | * | 7/2017 | Shimizu | H10D 8/051 |
| 2017/0345903 A1 | * | 11/2017 | Shimizu | H01L 29/518 |

(Continued)

FOREIGN PATENT DOCUMENTS

| | | |
|---|---|---|
| JP | 3361062 B2 | 1/2003 |
| JP | 4218557 B2 | 2/2009 |

(Continued)

*Primary Examiner* — Britt Hanley
*Assistant Examiner* — Casey Paul Boatman
(74) *Attorney, Agent, or Firm* — Kim & Stewart LLP (57) ABSTRACT

A semiconductor device of embodiments includes: an electrode containing titanium (Ti); a silicon carbide layer; a first region provided between the silicon carbide layer and the electrode, containing silicon (Si) and oxygen (O), and having a thickness equal to or more than 2 nm and equal to or less than 10 nm; and a second region provided between the first region and the electrode and containing titanium (Ti) and silicon (Si).

9 Claims, 10 Drawing Sheets

(56) References Cited

U.S. PATENT DOCUMENTS

| | | | |
|---|---|---|---|
| 2018/0226474 A1* | 8/2018 | Shimizu | H10D 62/393 |
| 2020/0091118 A1 | 3/2020 | Matsuyama | |
| 2020/0091295 A1* | 3/2020 | Ohashi | H01L 29/1608 |
| 2020/0185359 A1 | 6/2020 | Nakashima et al. | |
| 2020/0279940 A1* | 9/2020 | Kono | H01L 29/7802 |
| 2022/0037473 A1* | 2/2022 | Sundaresan | H10D 62/364 |

FOREIGN PATENT DOCUMENTS

| | | |
|---|---|---|
| JP | 2009-094433 A | 4/2009 |
| JP | 5367332 B2 | 12/2013 |
| JP | 6584966 B2 | 10/2019 |
| JP | 2020-047677 A | 3/2020 |
| WO | WO-2016113004 A1 * | 7/2016 |
| WO | 2019/044748 A1 | 3/2019 |

* cited by examiner

SEMICONDUCTOR DEVICE AND SEMICONDUCTOR DEVICE MANUFACTURING METHOD

CROSS-REFERENCE TO RELATED APPLICATION

This application is based upon and claims the benefit of priority from Japanese Patent Application No. 2021-154469, filed on Sep. 22, 2021, the entire contents of which are incorporated herein by reference.

FIELD

Embodiments described herein relate generally to a semiconductor device and a semiconductor device manufacturing method.

BACKGROUND

Silicon carbide (SiC) is expected as a material for next-generation semiconductor devices. Silicon carbide has excellent physical properties, such as a bandgap of 3 times, a breakdown field strength of about 10 times, and a thermal conductivity of about 3 times that of silicon (Si). By using such characteristics, it is possible to realize a power semiconductor device that has a high breakdown voltage and low loss and that can operate at high temperature.

For example, in a metal oxide semiconductor field effect transistor (MOSFET) using silicon carbide, it is desired to reduce the contact resistance between the silicon carbide layer and the metal electrode. By reducing the contact resistance, for example, the steady-state loss and switching loss of the MOSFET are reduced.

DETAILED DESCRIPTION

A semiconductor device of embodiments includes: an electrode containing titanium (Ti); a silicon carbide layer; a first region provided between the silicon carbide layer and the electrode, containing silicon (Si) and oxygen (O), and having a thickness equal to or more than 2 nm and equal to or less than 10 nm; and a second region provided between the first region and the electrode and containing titanium (Ti) and silicon (Si).

Hereinafter, embodiments will be described with reference to the diagrams. In the following description, the same or similar members and the like may be denoted by the same reference numerals, and the description of the members and the like once described may be omitted as appropriate.

In addition, in the following description, when there are notations of $n^+$, n, $n^-$, $p^+$, p, and $p^-$, these notations indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

In addition, in this specification, the "p-type impurity concentration" in the p-type silicon carbide region means the net p-type impurity concentration obtained by subtracting the n-type impurity concentration in the region from the p-type impurity concentration in the region. In addition, the "n-type impurity concentration" in the n-type silicon carbide region means the net n-type impurity concentration obtained by subtracting the p-type impurity concentration in the region from the n-type impurity concentration in the region.

In addition, unless otherwise specified in this specification, the impurity concentration in a specific region means the maximum impurity concentration in the region.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated by, for example, SIMS. In addition, the distance such as the width or depth of the impurity region can be calculated from, for example, an SCM image or an image of a scanning electron microscope (SEM). In addition, the thickness of an insulating layer and the like can be measured, for example, on the image of SIMS, SEM, or transmission electron microscope (TEM). In addition, qualitative analysis and quantitative analysis of the chemical composition of the members forming the semiconductor device can be performed by, for example, SIMS, electron energy loss spectroscopy (EELS), and energy dispersive X-ray spectroscopy (EDX).

First Embodiment

A semiconductor device of a first embodiment includes: an electrode containing titanium (Ti); a silicon carbide layer; a first region provided between the silicon carbide layer and the electrode, containing silicon (Si) and oxygen (O), and having a thickness equal to or more than 2 nm and equal to or less than 10 nm; and a second region provided between the first region and the electrode and containing titanium (Ti) and silicon (Si).

Figure 1:
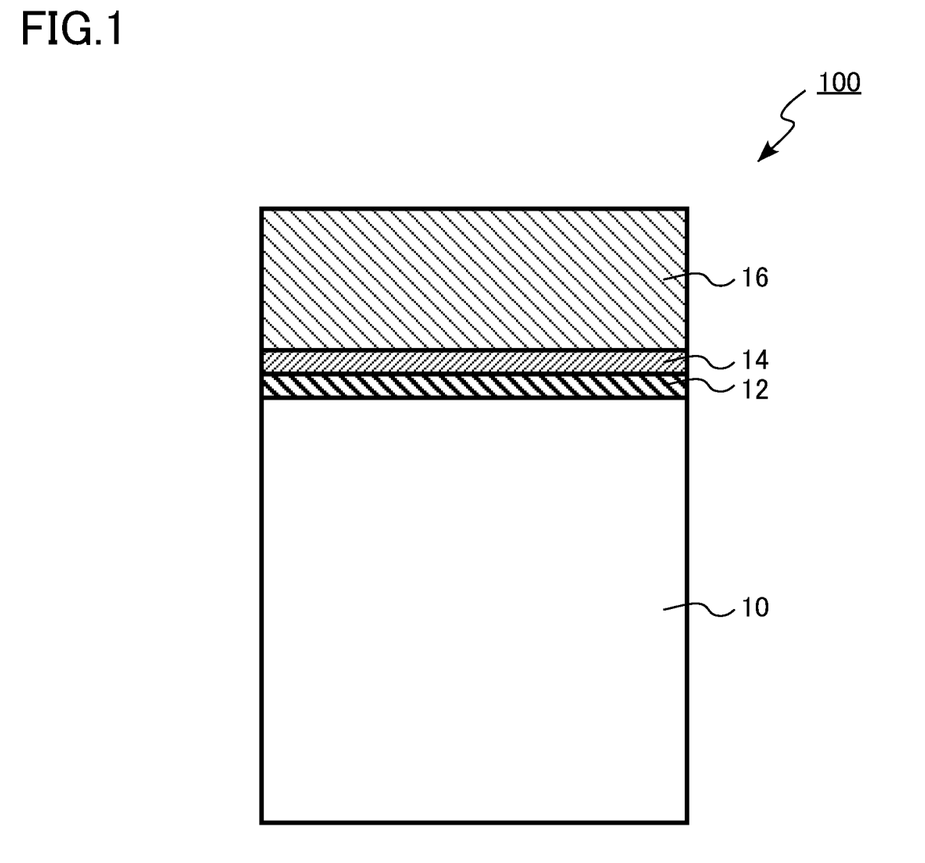
FIG. 1 is a schematic cross-sectional view of a semiconductor device of a first embodiment.

FIG. 1 is a schematic cross-sectional view of the semiconductor device of the first embodiment. The semiconductor device of the first embodiment is a contact structure 100 including a silicon carbide layer and a contact electrode.

The contact structure 100 includes a silicon carbide layer 10, a first intermediate region 12 (first region), a second intermediate region 14 (second region), and a contact electrode 16 (electrode). The first intermediate region 12 is an example of the first region.

The second intermediate region 14 is an example of the second region. The contact electrode 16 is an example of an electrode.

Figure 2:
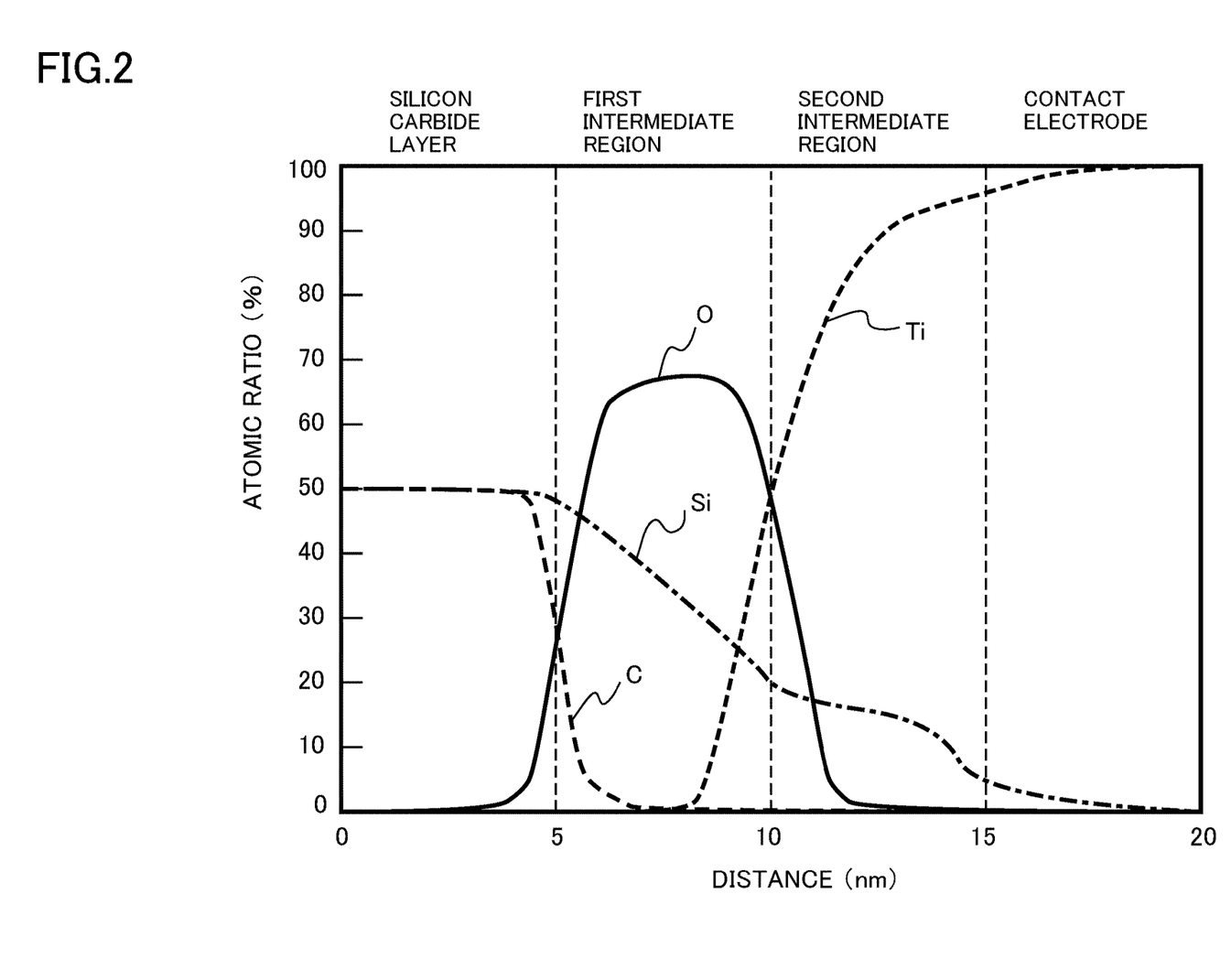
FIG. 2 is a diagram showing an example of the element distribution of the semiconductor device of the first embodiment.

FIG. 2 is a diagram showing an example of the element distribution of the semiconductor device of the first embodiment. FIG. 2 shows the atomic ratio of elements contained in the contact structure 100. FIG. 2 shows the distribution of the atomic ratios of the elements in a direction from the silicon carbide layer 10 to the contact electrode 16.

The silicon carbide layer 10 is a single crystal SiC. The silicon carbide layer 10 is, for example, 4H-SiC. The surface of the silicon carbide layer 10 is, for example, a surface inclined at an angle equal to or more than 0° and equal to or less than 8° with respect to the (0001) face.

The silicon carbide layer 10 contains, for example, n-type impurities. The n-type impurities are, for example, nitrogen (N) or phosphorus (P). The n-type impurity concentration in the silicon carbide layer 10 is equal to or more than $1 \times 10^{19}$ $cm^{-3}$, for example.

The silicon carbide layer 10 contains, for example, p-type impurities. The p-type impurities are, for example, aluminum (Al). The p-type impurity concentration in the silicon carbide layer 10 is equal to or more than $1 \times 10^{19}$ $cm^{-3}$, for example.

The first intermediate region 12 is provided on the silicon carbide layer 10. The first intermediate region 12 is provided between the silicon carbide layer 10 and the contact electrode 16. The first intermediate region 12 is provided between the silicon carbide layer 10 and the second intermediate region 14. The first intermediate region 12 is in contact with, for example, the silicon carbide layer 10.

The first intermediate region 12 contains silicon (Si) and oxygen (O). The first intermediate region 12 contains, for example, silicon (Si) and oxygen (O) as main components. The fact that the first intermediate region 12 contains silicon (Si) and oxygen (O) as main components means that there are no elements having a higher atomic ratio than silicon (Si) and oxygen (O) in the first intermediate region 12.

The oxygen atom ratio in the first intermediate region 12 is higher than, for example, the silicon atom ratio in the first intermediate region 12. The carbon atom ratio in the first intermediate region 12 is lower than, for example, the silicon atom ratio in the first intermediate region 12. The carbon atom ratio in the first intermediate region 12 is equal to or less than $\frac{1}{10}$ of the silicon atom ratio in the first intermediate region 12, for example.

The oxygen atom concentration in the first intermediate region 12 is equal to or more than $2 \times 10^{21}$ $cm^{-3}$, for example.

The first intermediate region 12 contains, for example, silicon oxide. The first intermediate region 12 is, for example, a silicon oxide layer.

The thickness of the first intermediate region 12 is equal to or more than 2 nm and equal to or less than 10 nm. The boundary between the first intermediate region 12 and the silicon carbide layer 10 can be defined as, for example, a position where the carbon ratio and the oxygen ratio cross each other in the distribution of the atomic ratio shown in FIG. 2. In addition, the boundary between the first intermediate region 12 and the second intermediate region 14 can be defined as, for example, a position where the titanium ratio and the oxygen ratio cross each other in the distribution of the atomic ratio shown in FIG. 2.

The second intermediate region 14 is provided on the first intermediate region 12. The second intermediate region 14 is provided between the first intermediate region 12 and the contact electrode 16. The second intermediate region 14 is in contact with, for example, the first intermediate region 12.

The second intermediate region 14 contains titanium (Ti) and silicon (Si). The second intermediate region 14 contains, for example, titanium (Ti) and silicon (Si) as main components. The fact that the second intermediate region 14 contains titanium (Ti) and silicon (Si) as main components means that there are no elements having a higher atomic ratio than titanium (Ti) and silicon (Si) in the second intermediate region 14.

The titanium atom ratio in the second intermediate region 14 is higher than, for example, the silicon atom ratio in the second intermediate region 14. The oxygen atom ratio in the second intermediate region 14 is lower than, for example, the titanium atom ratio in the second intermediate region 14.

The second intermediate region 14 contains, for example, titanium silicide. The second intermediate region 14 is, for example, a titanium silicide layer.

The thickness of the second intermediate region 14 is equal to or more than 2 nm and equal to or less than 10 nm, for example. The boundary between the second intermediate region 14 and the first intermediate region 12 can be defined as, for example, a position where the oxygen ratio and the titanium ratio cross each other in the distribution of the atomic ratio shown in FIG. 2. In addition, the boundary between the second intermediate region 14 and the contact electrode 16 can be defined as, for example, a position where the titanium ratio is 95% in the distribution of the atomic ratio shown in FIG. 2.

The contact electrode 16 is provided on the second intermediate region 14. The contact electrode 16 is in contact with, for example, the second intermediate region 14.

The contact electrode 16 contains titanium (Ti). The contact electrode 16 contains, for example, titanium (Ti) as a main component. The fact that the contact electrode 16 contains titanium (Ti) as a main component means that there are no elements having a higher atomic ratio than titanium (Ti) in the contact electrode 16.

The contact electrode 16 is, for example, a titanium layer.

The thickness of the contact electrode 16 is equal to or more than 50 nm and equal to or less than 300 nm, for example.

Next, an example of a semiconductor device manufacturing method of the first embodiment will be described.

In the semiconductor device manufacturing method of the first embodiment, a silicon oxide film having a thickness equal to or more than 2 nm and equal to or less than 10 nm is formed on a silicon carbide layer, a titanium film is formed on the silicon oxide film, and heat treatment is performed at a temperature equal to or more than 400° C. and equal to or less than 600° C.

First, a silicon oxide film having a thickness equal to or more than 2 nm and equal to or less than 10 nm is formed on the silicon carbide layer. The silicon oxide film is formed by using, for example, a vapor phase growth method or a thermal oxidation method. The silicon oxide film is formed by using, for example, an atomic layer deposition method (ALD method).

Then, a titanium film is formed on the silicon oxide film. The titanium film is formed by using, for example, a chemical vapor deposition method (CVD method) or a sputtering method. The thickness of the titanium film is equal to or more than 30 nm and equal to or less than 300 nm, for example.

Then, heat treatment is performed at a temperature equal to or more than 400° C. and equal to or less than 1100° C. The heat treatment is performed, for example, in a non-oxidizing atmosphere. The heat treatment is performed, for example, in a nitrogen atmosphere or an argon atmosphere.

The heat treatment is performed by using, for example, rapid thermal anneal (RTA). The heat treatment time is equal to or more than 10 seconds and equal to or less than 500 seconds, for example.

By the semiconductor device manufacturing method described above, the contact structure 100 shown in FIG. 1 is formed.

Next, the function and effect of the semiconductor device and the semiconductor device manufacturing method of the first embodiment will be described.

As a result of the study by the inventors, it has been clarified that a contact structure having an ohmic characteristic can be realized by performing heat treatment with a thin silicon oxide film interposed between a silicon carbide layer and a titanium film.

Figure 3:
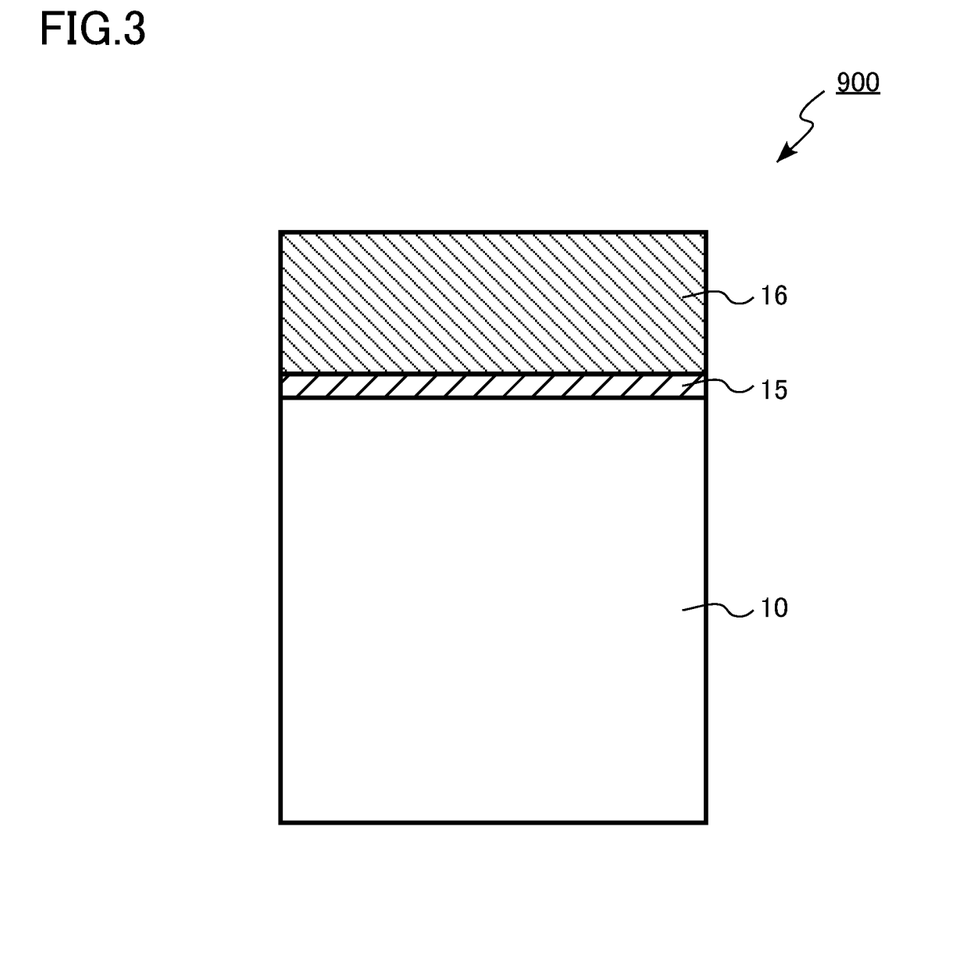
FIG. 3 is a schematic cross-sectional view of a semiconductor device of a comparative example of the first embodiment.

FIG. 3 is a schematic cross-sectional view of a semiconductor device of a comparative example of the first embodiment. The semiconductor device of the comparative example is a contact structure 900.

The contact structure 900 includes a silicon carbide layer 10, an intermediate region 15, and a contact electrode 16. The contact structure 900 is different from the contact structure 100 of the first embodiment in that the intermediate region 15 is provided instead of the first intermediate region 12 and the second intermediate region 14.

The intermediate region 15 contains titanium (Ti) and carbon (C). The intermediate region 15 contains titanium (Ti) and carbon (C) as main components. The fact that the intermediate region 15 contains titanium (Ti) and carbon (C) as main components means that there are no elements having a higher atomic ratio than titanium (Ti) and carbon (C) in the intermediate region 15.

The intermediate region 15 contains, for example, titanium carbide. The intermediate region 15 is, for example, a titanium carbide layer. The thickness of the intermediate region 15 is equal to or more than 2 nm and equal to or less than 10 nm, for example.

The contact structure 900 of the comparative example can be formed by omitting the formation of the silicon oxide film in the manufacturing method of the first embodiment.

First, a titanium film is formed on a silicon carbide layer. Then, heat treatment is performed at a temperature equal to or more than 400° C. and equal to or less than 600° C.

By the manufacturing method described above, the contact structure 900 of the comparative example shown in FIG. 3 is formed.

Figure 4:
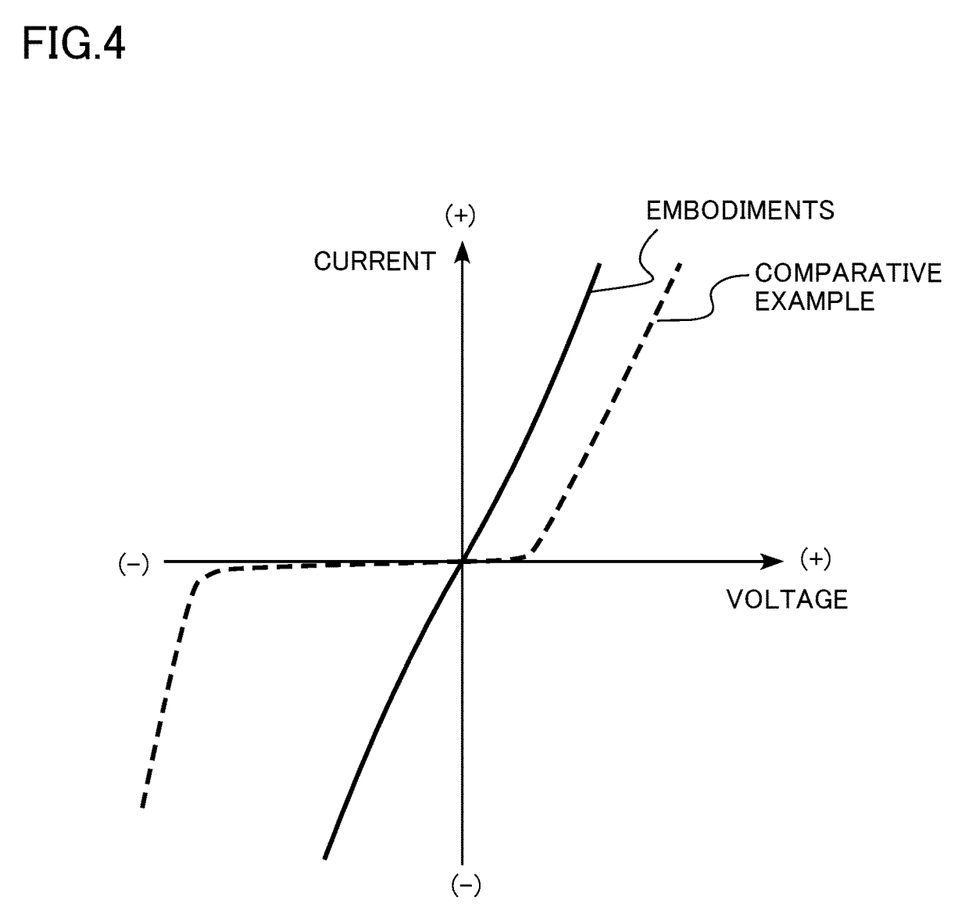
FIG. 4 is an explanatory diagram of the function and effect of the semiconductor device of the first embodiment.

FIG. 4 is an explanatory diagram of the function and effect of the semiconductor device of the first embodiment. FIG. 4 is a diagram showing voltage-current characteristics of the contact structure 100 of the embodiment and the contact structure 900 of the comparative example. FIG. 4 illustrates a case where the silicon carbide layer 10 of the contact structure 100 is n-type.

As shown in FIG. 4, in the case of the contact structure 100 of the embodiment, an ohmic characteristic is observed in the voltage-current characteristics. On the other hand, in the case of the contact structure 900 of the comparative example, a rectification characteristic is observed in the voltage-current characteristics.

By the contact structure 100 of the embodiment, it is possible to reduce the contact resistance between the silicon carbide layer and the contact electrode.

Factors that the contact structure 100 of the embodiment makes an ohmic characteristic observed in the voltage-current characteristics are not always clear. As a first factor, it is thought that the work function of the second intermediate region 14 containing titanium (Ti) and silicon (Si) is low and accordingly, the Schottky barrier height of the contact structure 100 is reduced. In addition, as a second factor, it is thought that the Schottky barrier height of the contact structure 100 is pinned to a state where the Schottky barrier height is low due to a defect included in the first intermediate region 12 containing silicon (Si) and oxygen (O) or a defect present at the interface between the silicon carbide layer 10 and the first intermediate region 12. In addition, it is thought that the combination of the first factor and the second factor makes an ohmic characteristic observed in the voltage-current characteristics.

From the viewpoint of reducing contact resistance, the thickness of the first intermediate region 12 needs to be equal to or more than 2 nm and equal to or less than 10 nm. From the viewpoint of reducing contact resistance, the thickness of the first intermediate region 12 is preferably equal to or more than 3 nm and equal to or less than 8 nm.

From the viewpoint of reducing contact resistance, the n-type impurity concentration in the silicon carbide layer 10 is preferably equal to or more than $1 \times 10^{19}$ cm$^{-3}$, and more preferably equal to or more than $1 \times 10^{20}$ cm$^{-3}$.

From the viewpoint of reducing contact resistance, the p-type impurity concentration in the silicon carbide layer 10 is preferably equal to or more than $1 \times 10^{19}$ cm$^{-3}$, and more preferably equal to or more than $1 \times 10^{20}$ cm$^{-3}$.

From the viewpoint of reducing contact resistance, the oxygen atom concentration in the first intermediate region 12 is preferably equal to or more than $2 \times 10^{21}$ cm$^{-3}$, more preferably equal to or more than $5 \times 10^{21}$ cm$^{-3}$, and even more preferably equal to or more than $1 \times 10^{22}$ cm$^{-3}$.

From the viewpoint of reducing contact resistance, the thickness of the second intermediate region 14 is preferably equal to or more than 2 nm and equal to or less than 10 nm, and more preferably equal to or more than 3 nm and equal to or less than 8 nm.

As described above, according to the first embodiment, it is possible to realize a semiconductor device capable of reducing contact resistance and a method of manufacturing the same.

Second Embodiment

A semiconductor device of a second embodiment includes: a silicon carbide layer having a first face and a second face facing the first face and including: a first silicon carbide region of a first conductive type including a first portion in contact with the first face; a second silicon carbide region of a second conductive type provided between the first silicon carbide region and the first face; a third silicon carbide region of a second conductive type provided between the second silicon carbide region and the first face and having a second conductive type impurity concentration higher than that in the second silicon carbide region; and a fourth silicon carbide region of a first conductive type provided between the second silicon carbide region and the first face; a gate electrode provided on a side of the first face of the silicon carbide layer; a gate insulating layer provided between the second silicon carbide region and the gate electrode; a first electrode provided on the side of the first face of the silicon carbide layer and containing titanium (Ti); a first region provided between the fourth silicon carbide region and the first electrode, containing silicon (Si) and oxygen (O), and having a thickness equal to or more than 2 nm and equal to or less than 10 nm; a second region provided between the first region and the first electrode and containing titanium (Ti) and silicon (Si); a third region provided between the first portion and the first electrode and containing titanium (Ti) and carbon (C); and a second electrode provided on a side of the second face of the silicon carbide layer.

Figure 5:
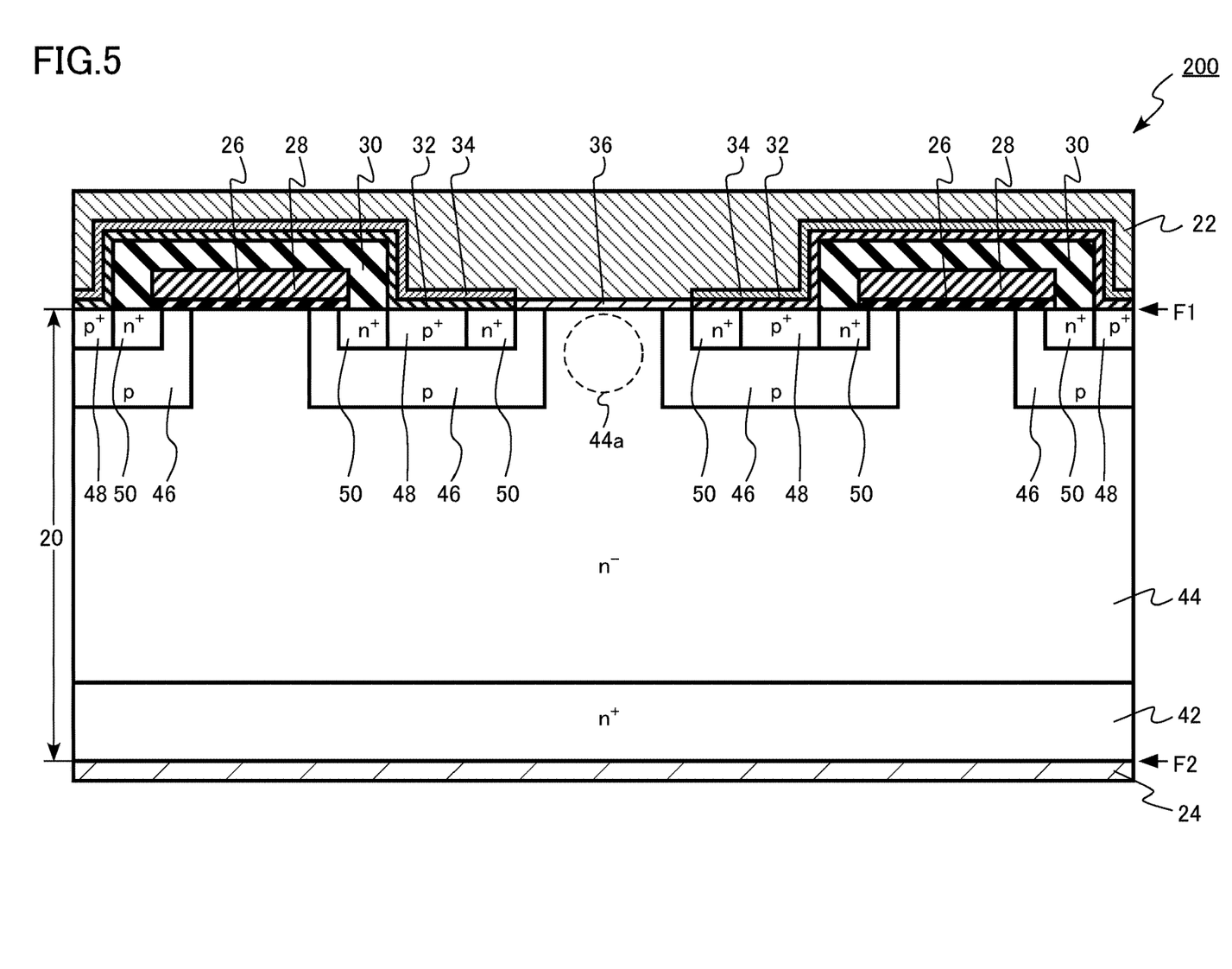
FIG. 5 is a schematic cross-sectional view of a semiconductor device of a second embodiment.

FIG. 5 is a schematic cross-sectional view of the semiconductor device of a second embodiment.

The semiconductor device of the second embodiment is a planar gate type vertical MOSFET 200 using silicon carbide. A MOSFET 200 of the second embodiment is, for example, a double implantation MOSFET (DIMOSFET) in which a body region and a source region are formed by ion implantation. In addition, the semiconductor device of the second embodiment includes a Schottky barrier diode (SBD) as a built-in diode.

In the MOSFET 200 of the second embodiment, the contact structure 100 of the first embodiment is applied as a contact structure between a source electrode and a source region. In addition, in the MOSFET 200, the contact structure 900 of the comparative example is applied as a Schottky barrier structure of the SBD. Hereinafter, the description of a part of the content overlapping the content of the first embodiment may be omitted.

Hereinafter, a case where the first conductive type is n-type and the second conductive type is p-type will be described as an example. The MOSFET 200 is a vertical re-channel MOSFET having electrons as carriers.

The MOSFET 200 includes a silicon carbide layer 20, a source electrode 22 (first electrode), a drain electrode 24 (second electrode), a gate insulating layer 26, a gate electrode 28, an interlayer insulating layer 30, a first contact region 32 (first region), a second contact region 34 (second region), and a Schottky region 36 (third region).

The silicon carbide layer 20 includes an n$^+$-type drain region 42, an n-type drift region 44 (first silicon carbide region), a p-type body region 46 (second silicon carbide region), a p$^+$-type body contact region 48 (third silicon carbide region), and an n$^+$-type source region 50 (fourth silicon carbide region).

The drift region 44 has a first portion 44a.

The source electrode 22 is an example of the first electrode. The drain electrode 24 is an example of the second electrode. The first contact region 32 is an example of the first region. The second contact region 34 is an example of the second region. The Schottky region 36 is an example of the third region. The drift region 44 is an example of the first silicon carbide region. The body region 46 is an example of the second silicon carbide region. The body contact region 48 is an example of the third silicon carbide region. The source region 50 is an example of the fourth silicon carbide region.

The silicon carbide layer 20 is provided between the source electrode 22 and the drain electrode 24. The silicon carbide layer 20 is a single crystal SiC. The silicon carbide layer 20 is, for example, 4H-SiC.

The silicon carbide layer 20 includes a first face ("F1" in FIG. 5) and a second face ("F2" in FIG. 5). Hereinafter, the first face F1 may be referred to as a surface, and the second face F2 may be referred to as a back surface. The first face F1 is disposed on the source electrode 22 side of the silicon carbide layer 20. In addition, the second face F2 is disposed on the drain electrode 24 side of the silicon carbide layer 20. The first face F1 and the second face F2 face each other. Hereinafter, the "depth" means a depth in a direction toward the second face with the first face as a reference.

The first face is parallel to the first and second directions. The second direction is perpendicular to the first direction.

The first face F1 is, for example, a face inclined by an angle equal to or more than 0° and equal to or less than 8° with respect to the (0001) face. In addition, the second face F2 is, for example, a face inclined by an angle equal to or more than 0° and equal to or less than 8° with respect to the (000-1) face. The (0001) face is referred to as a silicon face. The (000-1) face is referred to as a carbon face.

The n$^+$-type drain region 42 is provided on the back surface side of the silicon carbide layer 20. The drain region 42 contains, for example, nitrogen (N) as an n-type impurity. The n-type impurity concentration in the drain region 42 is equal to or more than $1\times10^{18}$ cm$^{-3}$ and equal to or less than $1\times10^{21}$ cm$^{-3}$, for example.

The n$^+$-type drift region 44 is provided between the drain region 42 and the first face F1. The n-type drift region 44 is provided between the source electrode 22 and the drain electrode 24. The n-type drift region 44 is provided between the gate electrode 28 and the drain electrode 24.

The drift region 44 is provided on the drain region 42. The drift region 44 contains, for example, nitrogen (N) as an n-type impurity. The n-type impurity concentration in the drift region 44 is lower than the n-type impurity concentration in the drain region 42. The n-type impurity concentration in the drift region 44 is equal to or more than $4\times10^{14}$ cm$^{-3}$ and equal to or less than $1\times10^{17}$ cm$^{-3}$, for example. The thickness of the drift region 44 is equal to or more than 3 μm and equal to or less than 150 μm, for example.

The drift region 44 has the first portion 44a. The first portion 44a is in contact with the first face F1. The first portion 44a functions as a cathode region of the SBD.

The p-type body region 46 is provided between the drift region 44 and the first face F1. The body region 46 functions as a channel region of the MOSFET 200.

The body region 46 contains, for example, aluminum (Al) as a p-type impurity. The p-type impurity concentration in the body region 46 is equal to or more than $5\times10^{17}$ cm$^{-3}$ and equal to or less than $5\times10^{19}$ cm$^{-3}$, for example.

The depth of the body region 46 is equal to or more than 0.5 μm and equal to or less than 1.0 μm, for example.

The body region 46 is electrically connected to the source electrode 22. The body region 46 is fixed to the electric potential of the source electrode 22.

A part of the body region 46 is in contact with the first face F1. A part of the body region 46 faces the gate electrode 28. A part of the body region 46 becomes a channel region of the MOSFET 200. The gate insulating layer 26 is interposed between a part of the body region 46 and the gate electrode 28.

The p$^+$-type body contact region 48 is provided between the body region 46 and the first face F1. The body contact region 48 is provided between the body region 46 and the source electrode 22.

The p-type impurity concentration in the body contact region 48 is higher than the p-type impurity concentration in the body region 46.

The body contact region 48 contains, for example, aluminum (Al) as a p-type impurity. The p-type impurity concentration in the body contact region 48 is equal to or more than $1\times10^{19}$ cm$^{-3}$ and equal to or less than $1\times10^{21}$ cm$^{-3}$, for example.

The depth of the body contact region 48 is equal to or more than 0.1 µm and equal to or less than 0.6 µm, for example.

The body contact region 48 is electrically connected to the source electrode 22. The contact between the body contact region 48 and the source electrode 22 is, for example, an ohmic contact. The body contact region 48 is fixed to the electric potential of the source electrode 22.

The n$^+$-type source region 50 is provided between the body region 46 and the first face F1. The source region 50 is in contact with, for example, the first face F1.

The source region 50 contains, for example, phosphorus (P) or nitrogen (N) as an n-type impurity. The n-type impurity concentration in the source region 50 is higher than the n-type impurity concentration in the drift region 44.

The n-type impurity concentration in the source region 50 is equal to or more than $1\times10^{19}$ cm$^{-3}$ and equal to or less than $1\times10^{21}$ cm$^{-3}$, for example. The depth of the source region 50 is smaller than the depth of the body region 46. The depth of the source region 50 is equal to or more than 0.05 µm and equal to or less than 0.2 µm, for example.

The source region 50 is electrically connected to the source electrode 22. The contact between the source region 50 and the source electrode 22 is, for example, an ohmic contact. The source region 50 is fixed to the electric potential of the source electrode 22.

The gate electrode 28 is provided on the first face F1 side of the silicon carbide layer 20. The gate electrode 28 is a conductive layer. The gate electrode 28 is, for example, polycrystalline silicon containing p-type impurities or n-type impurities. The gate electrode 28 faces the body region 46.

The gate insulating layer 26 is provided between the gate electrode 28 and the body region 46. The gate insulating layer 26 is, for example, silicon oxide.

The interlayer insulating layer 30 is provided on the gate electrode 28 and the silicon carbide layer 20. The interlayer insulating layer 30 is, for example, a silicon oxide.

The source electrode 22 is provided on the first face F1 side of the silicon carbide layer 20. The source electrode 22 functions as a source electrode of the transistor and an anode electrode of the SBD.

The source electrode 22 contains titanium (Ti). The source electrode 22 contains, for example, titanium (Ti) as a main component. The fact that the source electrode 22 contains titanium (Ti) as a main component means that there are no elements having a higher atomic ratio than titanium (Ti) in the source electrode 22.

The source electrode 22 is, for example, a titanium layer. The thickness of the titanium film is equal to or more than 50 nm and equal to or less than 300 nm, for example.

The source electrode 22 may have, for example, a stacked structure in which an aluminum layer is stacked on a titanium layer.

The first contact region 32 is provided between the body contact region 48 and the source electrode 22. The first contact region 32 is in contact with, for example, the body contact region 48.

The first contact region 32 is provided between the source region 50 and the source electrode 22. The first contact region 32 is in contact with, for example, the source region 50.

The first contact region 32 contains silicon (Si) and oxygen (O). The first contact region 32 contains, for example, silicon (Si) and oxygen (O) as main components. The fact that the first contact region 32 contains silicon (Si) and oxygen (O) as main components means that there are no elements having a higher atomic ratio than silicon (Si) and oxygen (O) in the first contact region 32.

The oxygen atom ratio in the first contact region 32 is higher than, for example, the silicon atom ratio in the first contact region 32. The carbon atom ratio in the first contact region 32 is lower than, for example, the silicon atom ratio in the first contact region 32.

The oxygen atom concentration in the first contact region 32 is equal to or more than $2\times10^{21}$ cm$^{-3}$, for example.

The first contact region 32 contains, for example, silicon oxide. The first contact region 32 is, for example, a silicon oxide layer.

The thickness of the first contact region 32 is equal to or more than 2 nm and equal to or less than 10 nm.

The second contact region 34 is provided on the first contact region 32. The second contact region 34 is provided between the first contact region 32 and the source electrode 22. The second contact region 34 is in contact with, for example, the first contact region 32. The second contact region 34 is in contact with, for example, the source electrode 22.

The second contact region 34 contains titanium (Ti) and silicon (Si). The second contact region 34 contains, for example, titanium (Ti) and silicon (Si) as main components. The fact that the second contact region 34 contains titanium (Ti) and silicon (Si) as main components means that there are no elements having a higher atomic ratio than titanium (Ti) and silicon (Si) in the second contact region 34.

The titanium atom ratio in the second contact region 34 is higher than, for example, the silicon atom ratio in the second contact region 34. The oxygen atom ratio in the second contact region 34 is lower than, for example, the titanium atom ratio in the second contact region 34.

The second contact region 34 contains, for example, titanium silicide. The second contact region 34 is, for example, a titanium silicide layer.

The thickness of the second contact region 34 is equal to or more than 2 nm and equal to or less than 10 nm, for example.

The Schottky region 36 is provided on the first portion 44a of the drift region 44. The Schottky region 36 is provided between the first portion 44a and the source electrode 22. The Schottky region 36 is in contact with, for example, the first portion 44a and the source electrode 22.

The Schottky region 36 contains titanium (Ti) and carbon (C). The Schottky region 36 contains titanium (Ti) and carbon (C) as main components. The fact that the Schottky region 36 contains titanium (Ti) and carbon (C) as main components means that there are no elements having a higher atomic ratio than titanium (Ti) and carbon (C) in the Schottky region 36.

The Schottky region 36 includes, for example, titanium carbide. The Schottky region 36 is, for example, a titanium carbide layer. The thickness of the Schottky region 36 is equal to or more than 2 nm and equal to or less than 10 nm, for example.

The drain electrode 24 is provided on the second face F2 side of the silicon carbide layer 20. The drain electrode 24 is provided on the second face F2 of the silicon carbide layer 20. The drain electrode 24 is in contact with the second face F2.

The drain electrode 24 contains, for example, a metal or a metal semiconductor compound. The drain electrode 24 includes, for example, a nickel silicide layer, a titanium layer, a nickel layer, a silver layer, or a gold layer.

The drain electrode 24 is electrically connected to the drain region 42. The drain electrode 24 is in contact with, for example, the drain region 42.

Next, an example of a method of manufacturing the MOSFET 200 of the second embodiment will be described.

FIGS. 6 to 10 are schematic cross-sectional views showing an example of a semiconductor device manufacturing method of the second embodiment. FIGS. 6 to 10 are cross-sectional views corresponding to FIG. 5.

Figure 6:
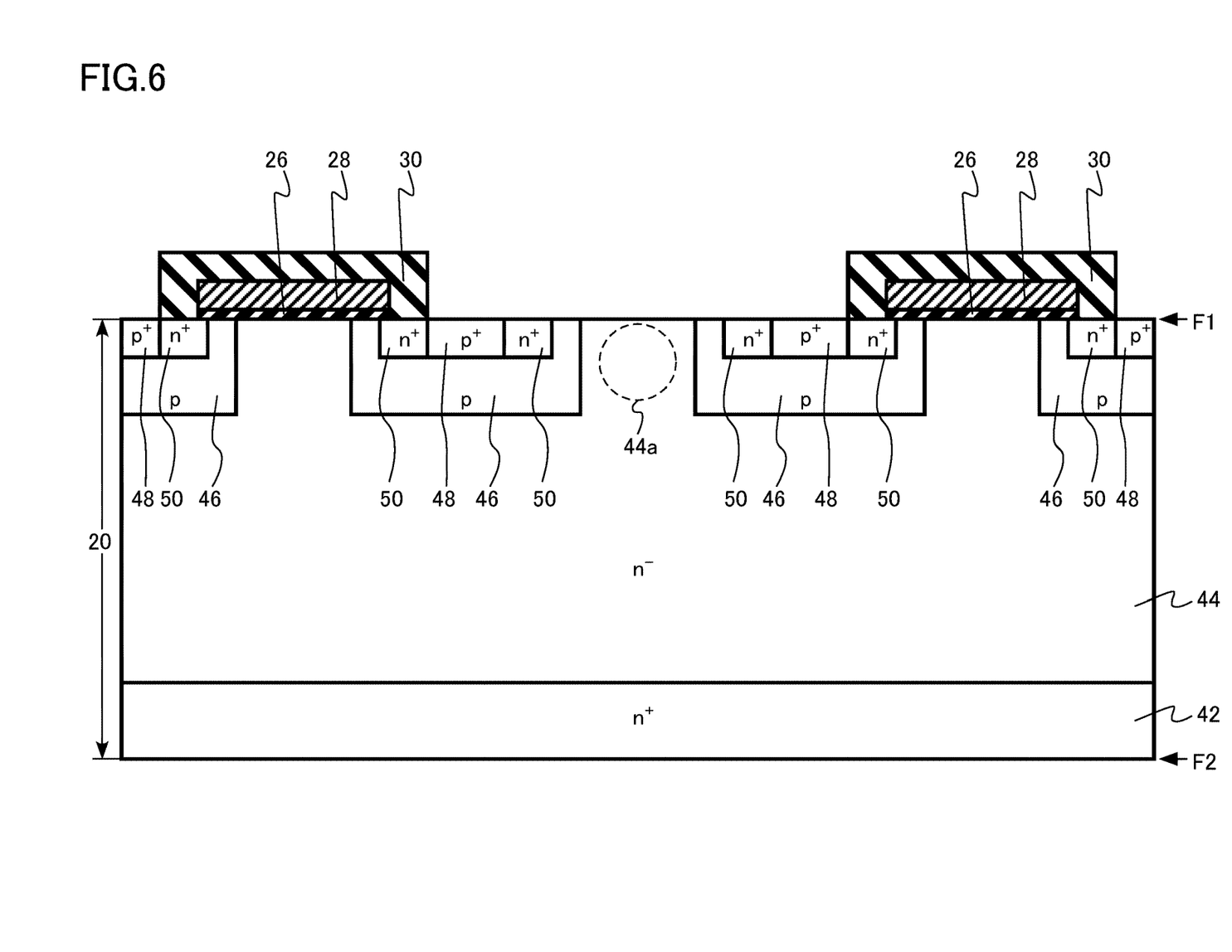
FIG. 6 is a schematic cross-sectional view showing an example of a semiconductor device manufacturing method of the second embodiment.

First, the silicon carbide layer 20 having the $n^+$-type drain region 42 and the $n^-$-type drift region 44, which is formed on the drain region 42 by epitaxial growth, is prepared.

Then, the p-type body region 46, the $p^+$-type body contact region 48, and the $n^+$-type source region 50 are formed in the silicon carbide layer 20 by using a known process technique.

Then, the gate insulating layer 26, the gate electrode 28, and the interlayer insulating layer 30 are formed on the surface of the silicon carbide layer 20 by using a known process technique. Thereafter, a part of the interlayer insulating layer 30 is opened to expose the surface of the silicon carbide layer 20 (FIG. 6).

Figure 7:
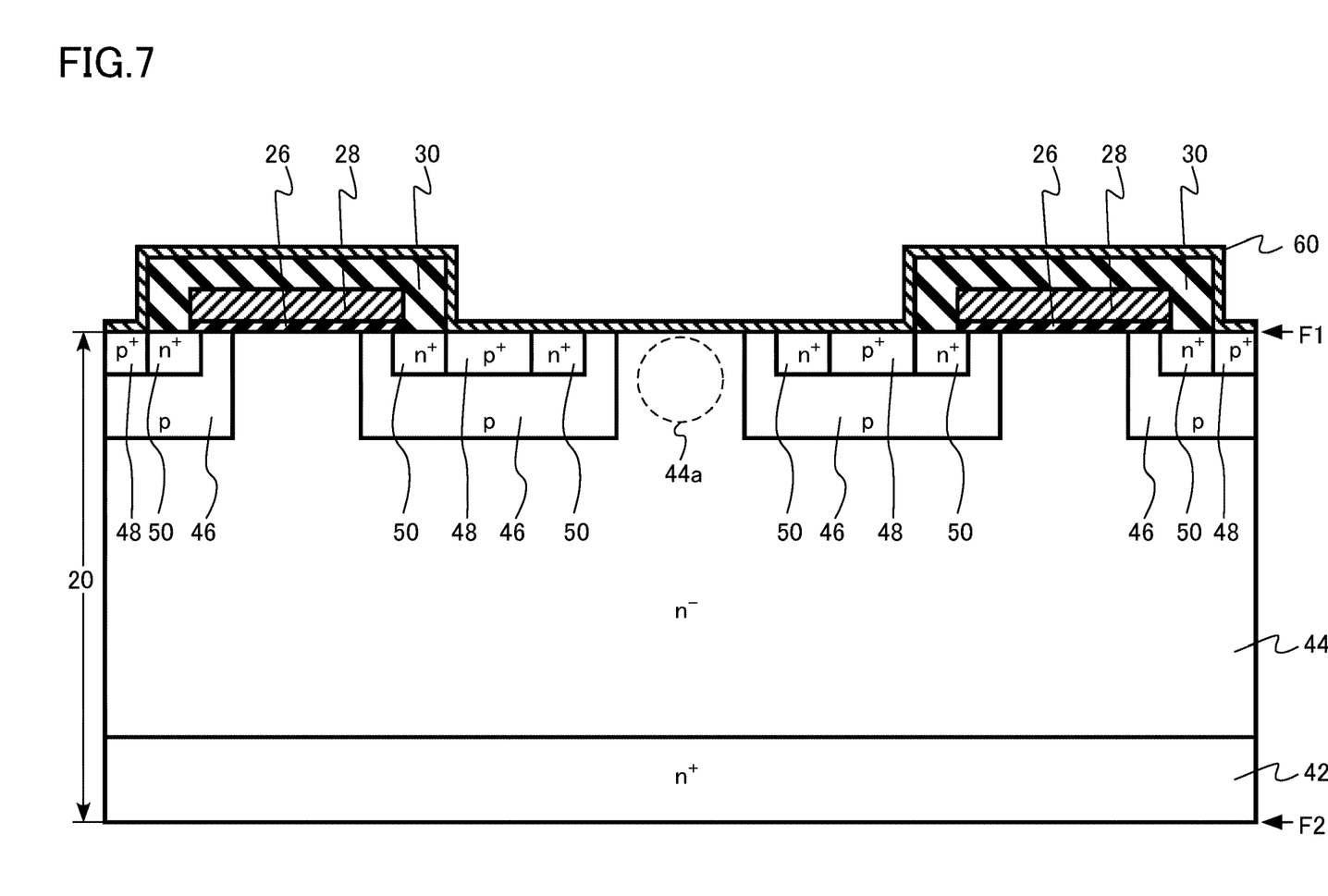
FIG. 7 is a schematic cross-sectional view showing an example of the semiconductor device manufacturing method of the second embodiment.

Then, a silicon oxide film 60 having a thickness equal to or more than 2 nm and equal to or less than 10 nm is formed (FIG. 7). The silicon oxide film 60 is formed by using, for example, a vapor phase growth method or a thermal oxidation method. The silicon oxide film 60 is formed by using, for example, an ALD method.

Figure 8:
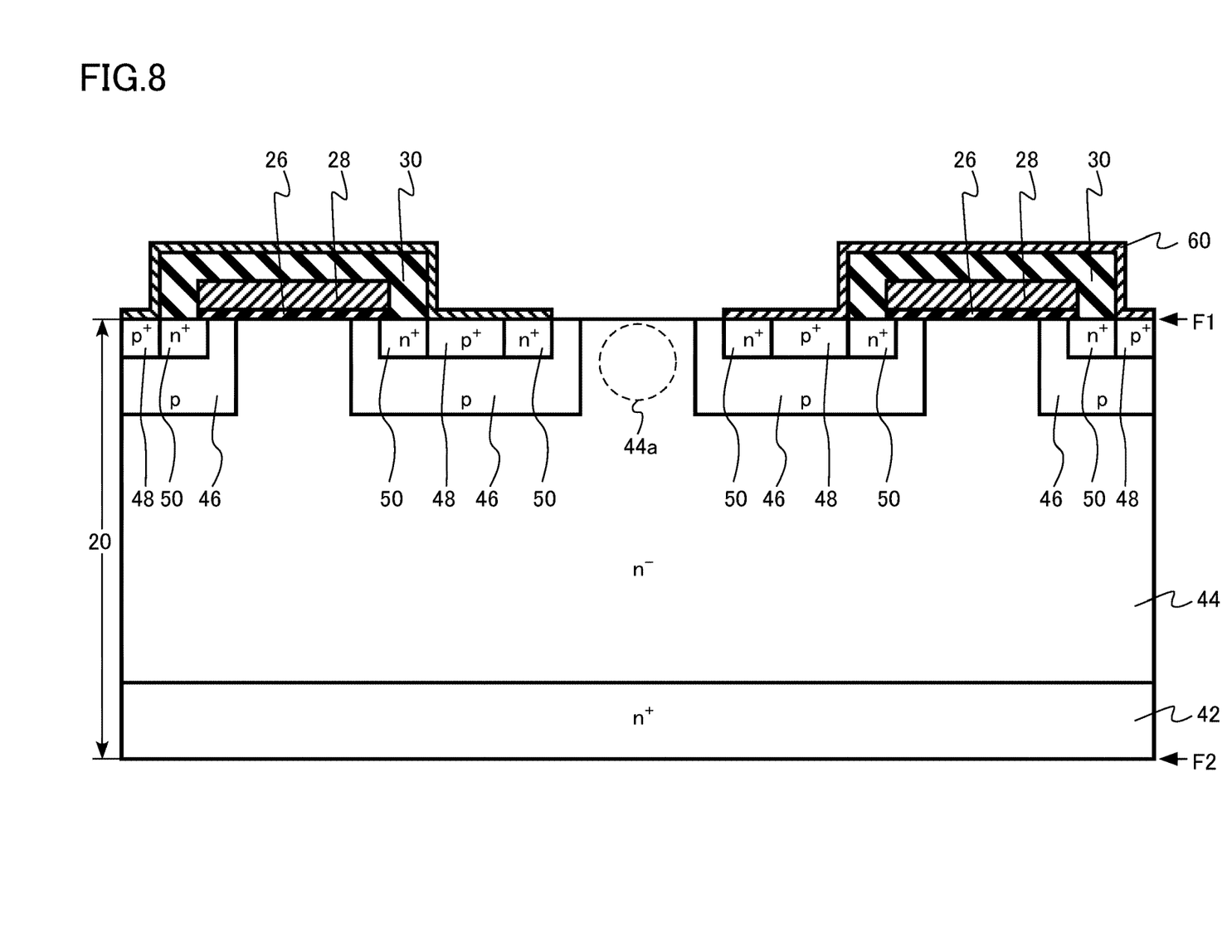
FIG. 8 is a schematic cross-sectional view showing an example of the semiconductor device manufacturing method of the second embodiment.

Then, a part of the silicon oxide film 60 is removed to expose at least the first portion 44a of the drift region 44 (FIG. 8).

Figure 9:
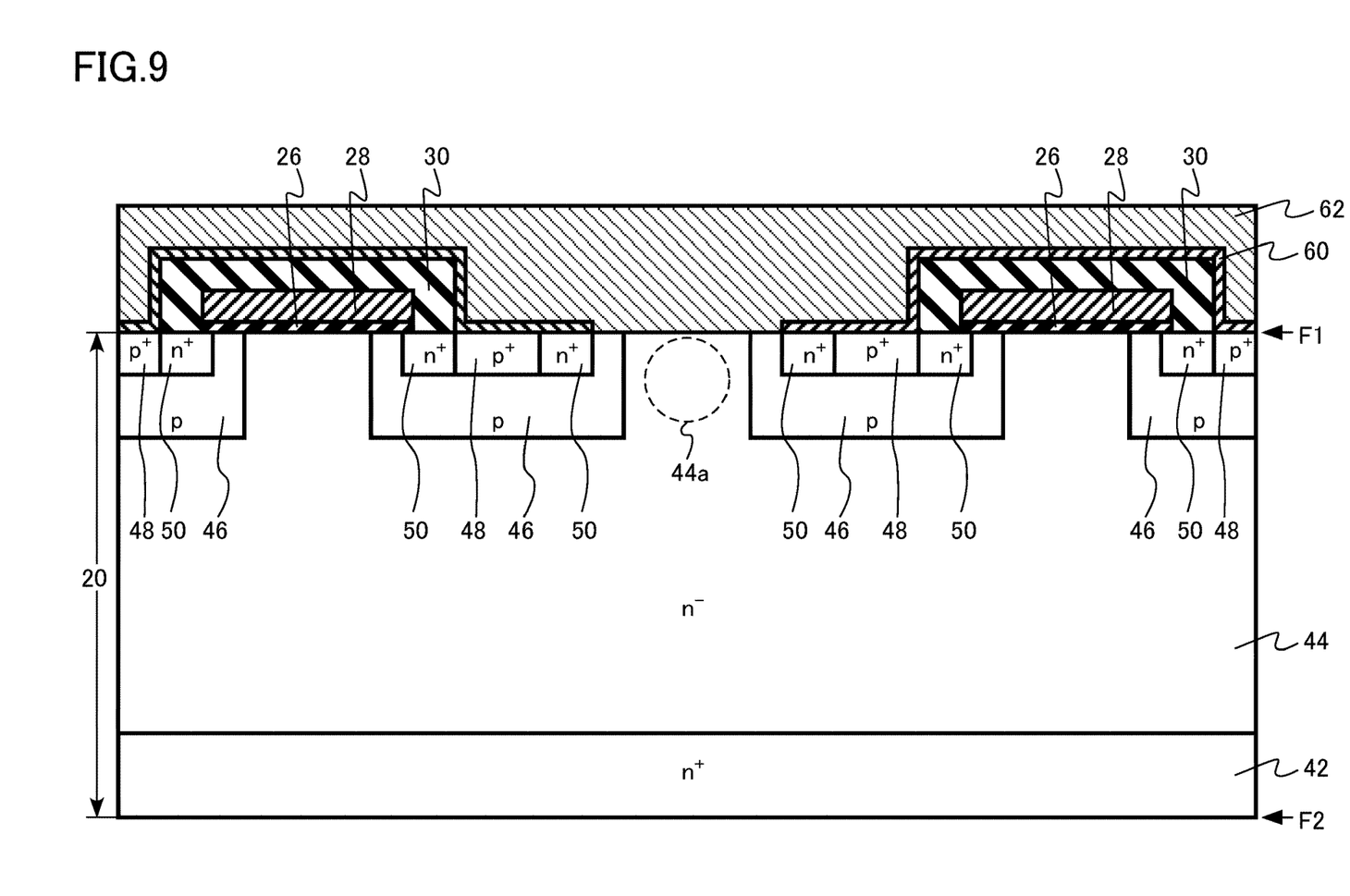
FIG. 9 is a schematic cross-sectional view showing an example of the semiconductor device manufacturing method of the second embodiment.

Then, a titanium film 62 is formed (FIG. 9). The titanium film 62 is formed by using, for example, a CVD method.

Then, heat treatment is performed at a temperature equal to or more than 400° C. and equal to or less than 600° C. The heat treatment is performed, for example, in a non-oxidizing atmosphere. The heat treatment is performed, for example, in a nitrogen atmosphere or an argon atmosphere.

The heat treatment is performed by using, for example, RTA. The heat treatment time is equal to or more than 10 seconds and equal to or less than 60 seconds, for example.

Figure 10:
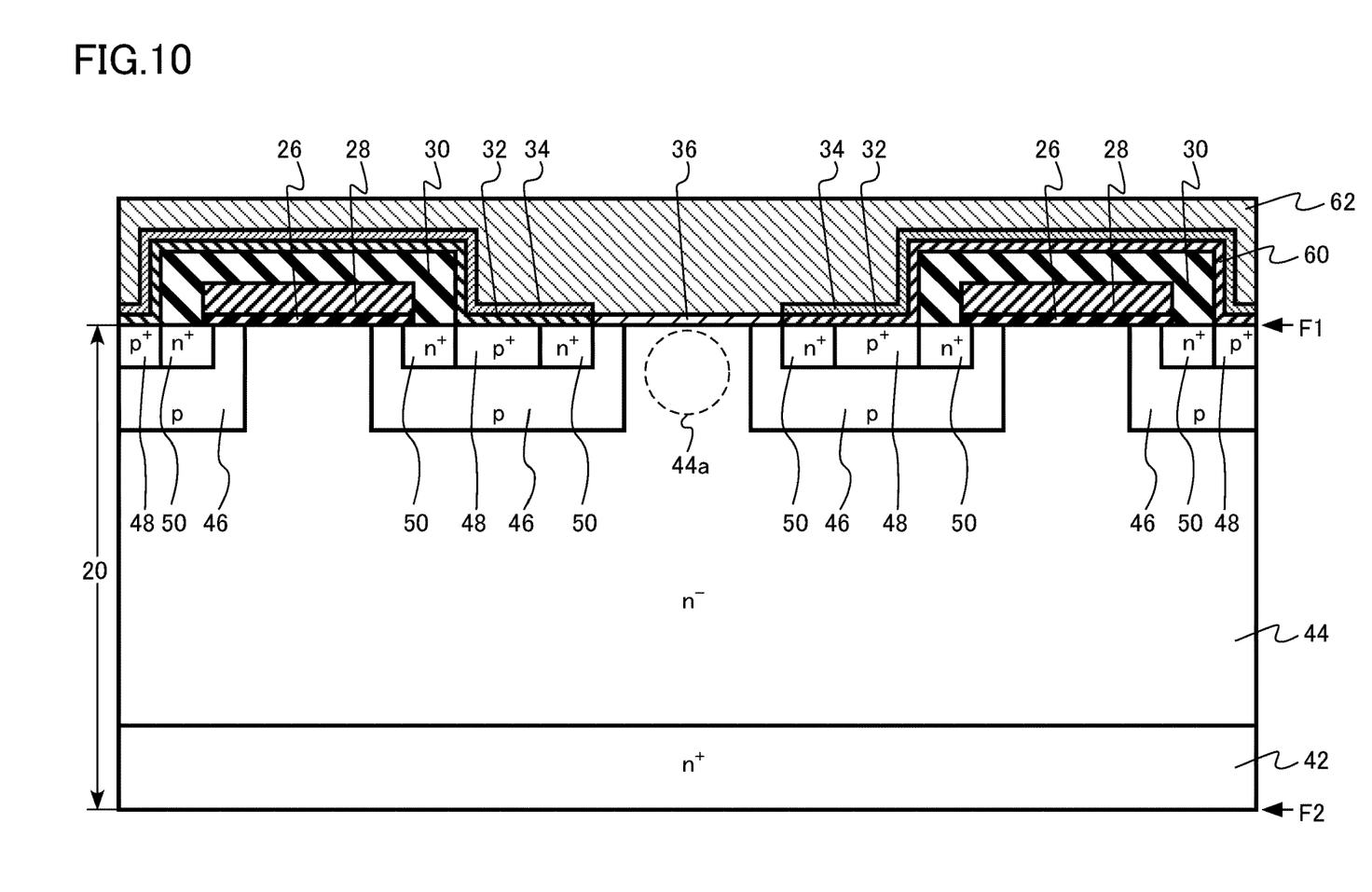
FIG. 10 is a schematic cross-sectional view showing an example of the semiconductor device manufacturing method of the second embodiment.

By the heat treatment, the first contact region 32 and the second contact region 34 are formed between the body contact region 48 and the titanium film 62. The first contact region 32 and the second contact region 34 are formed between the source region 50 and the titanium film 62.

In addition, by the heat treatment, the Schottky region 36 is formed between the first portion 44a of the drift region 44 and the titanium film 62 (FIG. 10). The titanium film 62 serves as the source electrode 22.

Then, the drain electrode 24 is formed on the back surface side of the silicon carbide layer 20 by using a known process technique.

By the manufacturing method described above, the MOSFET 200 shown in FIG. 5 is formed.

The contact resistance between the source electrode 22 and the body contact region 48 is reduced by providing the first contact region 32 and the second contact region 34. In addition, the contact resistance between the source electrode 22 and the source region 50 is reduced by providing the first contact region 32 and the second contact region 34.

By providing the Schottky region 36 between the source electrode 22 and the first portion 44a of the drift region 44, a Schottky contact having a rectification characteristic is formed between the source electrode 22 and the first portion 44a of the drift region 44. The source electrode 22 and the first portion 44a of the drift region 44 function as an SBD.

According to the second embodiment, the MOSFET 200 including the SBD as a built-in diode and having a reduced contact resistance is realized.

In addition, according to the second embodiment, it is possible to easily manufacture the MOSFET 200 including the SBD as a built-in diode and having a reduced contact resistance.

As described above, according to the second embodiment, it is possible to realize a semiconductor device capable of reducing contact resistance and a method of manufacturing the same.

In the first and second embodiments, the case of 4H—SiC has been described as an example of the crystal structure of SiC. However, embodiments can also be applied to devices using SiC having other crystal structures, such as 6H—SiC and 3C—SiC. In addition, a face other than the (0001) face can also be applied as the surface of the silicon carbide layer 20.

In the second embodiment, the case where the first conductive type is n-type and the second conductive type is p-type has been described as an example. However, the first conductive type can be p-type and the second conductive type can be n-type.

In the second embodiment, aluminum (Al) is exemplified as a p-type impurity, but boron (B) can also be used. In addition, although nitrogen (N) and phosphorus (P) are exemplified as n-type impurities, arsenic (As), antimony (Sb), and the like can also be applied.

In the second embodiment, the planar gate type MOSFET has been described as an example, but embodiments can also be applied to, for example, a trench gate type MOSFET.

While certain embodiments have been described, these embodiments have been presented by way of example only, and are not intended to limit the scope of the inventions. Indeed, the semiconductor device and the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   an electrode containing titanium (Ti);
   a silicon carbide layer;
   a first region provided between the silicon carbide layer and the electrode, containing silicon (Si) and oxygen (O), and having a thickness equal to or more than 2 nm and equal to or less than 10 nm; and
   a second region provided between the first region and the electrode and containing titanium (Ti) and silicon (Si),
   wherein a carbon atom ratio in the first region is equal to or less than $1/10$ of a silicon atom ratio in the first region,
   the first region and the second region are stacked in a direction perpendicular to a surface of the silicon carbide layer,
   the second region is in contact with the first region, and
   the first region is a silicon oxide layer.

2. The semiconductor device according to claim 1,
   wherein an oxygen atom ratio in the first region is higher than a silicon atom ratio in the first region.

3. A semiconductor device, comprising:
   an electrode containing titanium (Ti):
   a silicon carbide layer;

a first region provided between the silicon carbide layer and the electrode, containing silicon (Si) and oxygen (O), and having a thickness equal to or more than 2 nm and equal to or less than 10 nm; and a second region provided between the first region and the electrode and containing titanium (Ti) and silicon (Si), wherein a carbon atom ratio in the first region is equal to or less than 1/10 of a silicon atom ratio in the first region, the first region and the second region are stacked in a direction perpendicular to a surface of the silicon carbide layer, the second region is in contact with the first region, and an oxygen atom concentration in the first region is equal to or more than $2\times10^{21}$ cm$^{-3}$.

4. The semiconductor device according to claim 1, wherein an n-type impurity concentration or a p-type impurity concentration in the silicon carbide layer is equal to or more than $1\times10^{19}$ cm$^{-3}$.

5. The semiconductor device according to claim 1, wherein a thickness of the second region is equal to or more than 2 nm and equal to or less than 10 nm.

6. A semiconductor device, comprising:

a silicon carbide layer having a first face and a second face facing the first face and including:
 - a first silicon carbide region of a first conductive type including a first portion in contact with the first face;
 - a second silicon carbide region of a second conductive type provided between the first silicon carbide region and the first face;
 - a third silicon carbide region of a second conductive type provided between the second silicon carbide region and the first face and having a second conductive type impurity concentration higher than a second conductive type impurity concentration in the second silicon carbide region; and
 - a fourth silicon carbide region of a first conductive type provided between the second silicon carbide region and the first face;

a gate electrode provided on a side of the first face of the silicon carbide layer;

a gate insulating layer provided between the second silicon carbide region and the gate electrode;

a first electrode provided on the side of the first face of the silicon carbide layer and containing titanium (Ti);

a first region provided between the fourth silicon carbide region and the first electrode, containing silicon (Si) and oxygen (O), and having a thickness equal to or more than 2 nm and equal to or less than 10 nm;

a second region provided between the first region and the first electrode and containing titanium (Ti) and silicon (Si);

a third region provided between the first portion and the first electrode and containing titanium (Ti) and carbon (C); and a second electrode provided on a side of the second face of the silicon carbide layer, wherein a carbon atom ratio in the first region is equal to or less than 1/10 of a silicon atom ratio in the first region, the first region and the second region are stacked in a direction perpendicular to a surface of the silicon carbide layer, and the second region is in contact with the first region.

7. The semiconductor device according to claim 6, wherein the first region is provided between the third silicon carbide region and the first electrode.

8. The semiconductor device according to claim 6, wherein an oxygen atom ratio in the first region is higher than a silicon atom ratio in the first region.

9. The semiconductor device according to claim 6, wherein an oxygen atom concentration in the first region is equal to or more than $2\times10^{21}$ cm$^{-3}$.

\* \* \* \* \*